(12) United States Patent
Sekiya

(10) Patent No.: US 10,843,313 B2
(45) Date of Patent: Nov. 24, 2020

(54) CHUCK TABLE MECHANISM

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 111 days.

(21) Appl. No.: 16/159,201

(22) Filed: Oct. 12, 2018

(65) Prior Publication Data

US 2019/0111547 A1 Apr. 18, 2019

(30) Foreign Application Priority Data

Oct. 17, 2017 (JP) ................................. 2017-201204

(51) Int. Cl.
*B25B 11/00* (2006.01)
*H01L 21/683* (2006.01)
*H01L 21/67* (2006.01)

(52) U.S. Cl.
CPC ...... *B25B 11/005* (2013.01); *H01L 21/67288* (2013.01); *H01L 21/6831* (2013.01); *H01L 21/6833* (2013.01); *H01L 21/6835* (2013.01); *H01L 21/6838* (2013.01); *H01L 2221/68327* (2013.01)

(58) Field of Classification Search
CPC ............. H01L 21/6831; H01L 21/6833; H01L 21/6838
See application file for complete search history.

(56) References Cited

U.S. PATENT DOCUMENTS

| | | | | |
|---|---|---|---|---|
| 3,711,081 A | * | 1/1973 | Cachon | G03F 7/70691 269/21 |
| 4,667,110 A | * | 5/1987 | Kariya | H01J 37/20 250/440.11 |
| 4,969,168 A | * | 11/1990 | Sakamoto | G03F 7/707 250/440.11 |
| 5,773,953 A | * | 6/1998 | Ukaji | G03F 7/70691 318/687 |
| 2001/0002283 A1 | * | 5/2001 | Sun | B01J 19/0046 427/469 |
| 2001/0033369 A1 | * | 10/2001 | Matsui | G03F 7/707 355/53 |
| 2005/0036267 A1 | * | 2/2005 | Savas | C23C 16/4586 361/234 |

(Continued)

FOREIGN PATENT DOCUMENTS

JP 2011044473 A 3/2011

*Primary Examiner* — Tyrone V Hall, Jr.
(74) *Attorney, Agent, or Firm* — Greer Burns & Crain, Ltd.

(57) ABSTRACT

A combined chuck table mechanism includes a chuck table, an electrostatic attraction section, and a vacuum suction section. The chuck table has a holding surface for holding a plate-shaped workpiece. The electrostatic attraction section has electrodes provided in the chuck table for charging an upper surface, a holding surface, through supply of power and electrostatically attracting the workpiece. The vacuum suction section has a porous portion that is formed to be flush with the upper surface, that communicates with a suction source, and that has fine holes, suction ports. The combined chuck table mechanism further includes a control unit adapted to achieve holding of the workpiece through a combined force by supplying power to the electrodes and a negative pressure to the suction ports.

20 Claims, 5 Drawing Sheets

(56) References Cited

U.S. PATENT DOCUMENTS

| | | | |
|---|---|---|---|
| 2005/0152088 A1* | 7/2005 | Ito | G03F 7/70708 361/233 |
| 2005/0231886 A1* | 10/2005 | Chiang | G02F 1/1341 361/234 |
| 2010/0194012 A1* | 8/2010 | Tatsumi | B65G 49/061 269/21 |
| 2012/0309115 A1* | 12/2012 | Koelmel | H01L 21/67109 438/5 |
| 2015/0132969 A1* | 5/2015 | Koiwa | H01L 21/67109 438/715 |

* cited by examiner

CHUCK TABLE MECHANISM

BACKGROUND OF THE INVENTION

Field of the Invention

The present invention relates to a chuck table mechanism.

Description of the Related Art

There is known a processing apparatus for dividing, grinding, and dry etching various types of plate-shaped workpieces such as wafers and package device substrates. Wafers are made of silicon, sapphire, lithium tantalate, silicon carbide, and the like, and semiconductor devices, optical devices such as light emitting diodes (LEDs) are formed thereon. Package device substrates have device chips therein.

For example, a cutting apparatus for dividing a workpiece with a cutting blade and a grinding apparatus for reducing the thickness of a workpiece with a grindstone secure a workpiece to a holding surface of a chuck table by vacuum suction for processing (see Japanese Patent Laid-Open No. 2011-044473, for example).

SUMMARY OF THE INVENTION

In the case of holding a wafer by the chuck table mechanism described in Japanese Patent Laid-Open No. 2011-044473, in a state where the wafer warps like a bowl shape or an inverted V shape by the film forming effect, or in a state where the wafer warps by the effects of a crushed layer formed while grinding is in progress, the wafer comes off the holding surface due to leak of a negative pressure unless sucked by strong vacuum means. Therefore, the chuck table mechanism described in Japanese Patent Laid-Open No. 2011-044473 has employed a strong suction source or needed a special mechanism for increasing the suction force so as to hold a wafer or other workpiece having a warp.

Further, in the case where a workpiece is held in a negative pressure chamber, the workpiece is held on an electrostatic chuck table. Electrostatic chuck tables have suffered a problem in that although they can exert a strong suction force on a workpiece as long as the workpiece is in close contact with the holding surface, if the workpiece warps and comes off the holding surface, an electrostatic attraction force cannot act on the workpiece, rendering it impossible to hold the workpiece.

It is therefore an object of the present invention to provide a chuck table mechanism that can hold a warping workpiece.

In accordance with an aspect of the present invention, there is provided a combined chuck table mechanism having an electrostatic attraction section and a vacuum suction section. The combined chuck table mechanism includes a chuck table having a holding surface for holding a plate-shaped workpiece, electrodes provided in the chuck table for charging the holding surface through supply of power and electrostatically attracting the workpiece, a suction port formed in the holding surface to communicate with a suction source, and a control unit adapted to achieve holding of the workpiece through a combined force by supplying power to the electrodes and a negative pressure to the suction ports.

The chuck table mechanism according to an aspect of the present invention provides an advantageous effect in that a warping workpiece can be held.

The above and other objects, features and advantages of the present invention and the manner of realizing them will become more apparent, and the invention itself will best be understood from a study of the following description and appended claim with reference to the attached drawings showing preferred embodiments of the invention.

DETAILED DESCRIPTION OF THE PREFERRED EMBODIMENTS

Preferred embodiments of the present invention will now be described in detail with reference to the drawings. The present invention is not limited to these embodiments. Further, the components used in these preferred embodiments may include those that can be easily assumed by persons skilled in the art or substantially the same as those known in the art. Further, the configurations described below may be suitably combined. Further, the configurations may be omitted, replaced, or changed in various manners without departing from the scope of the present invention.

Embodiment 1

Figure 1:
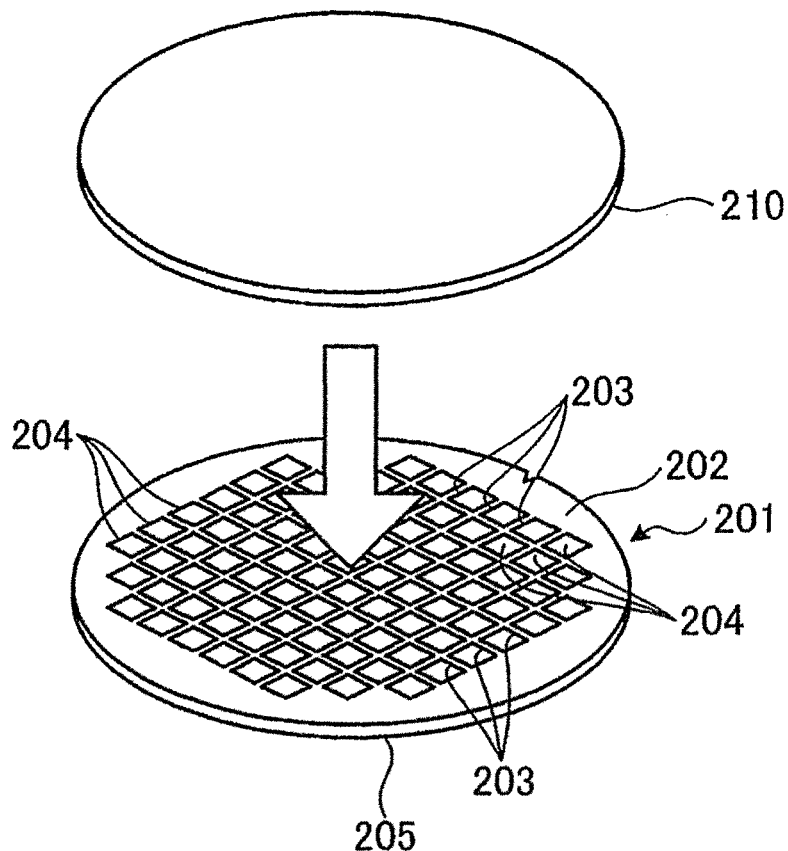
FIG. 1 is a perspective view illustrating a workpiece held on a chuck table mechanism according to embodiment 1.
Figure 2:
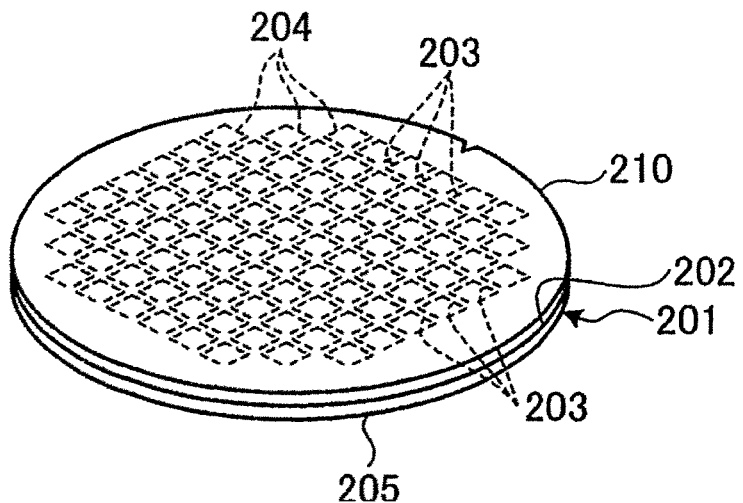
FIG. 2 is a perspective view illustrating a condition in which adhesive tape is applied to the front side of the workpiece illustrated in FIG. 1.

A chuck table mechanism according to embodiment 1 of the present invention will now be described based on the drawings. FIG. 1 is a perspective view illustrating a workpiece held on the chuck table mechanism according to embodiment 1. FIG. 2 is a perspective view illustrating a condition in which adhesive tape is applied to the front side of the workpiece illustrated in FIG. 1.

Figure 3:
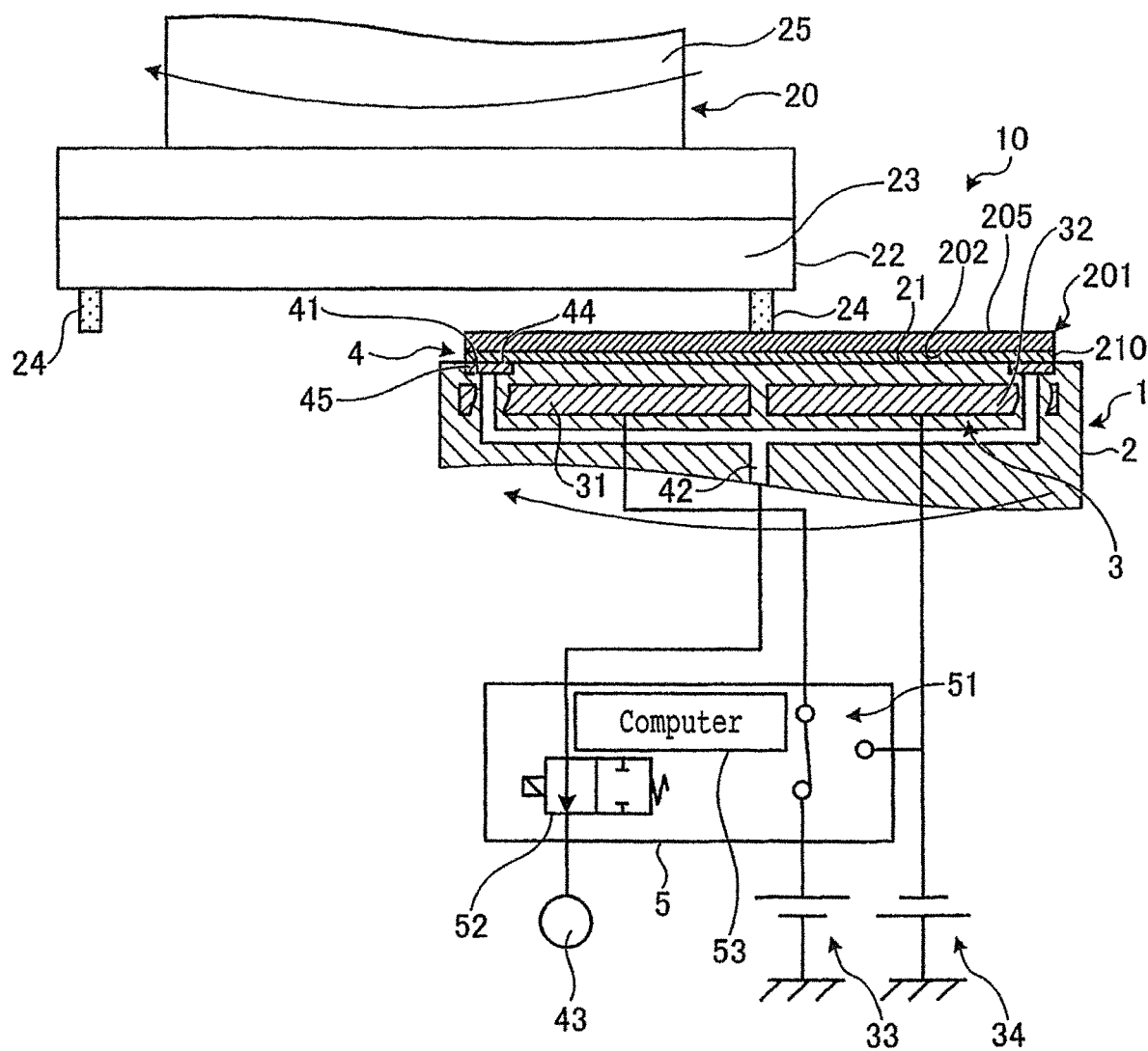
FIG. 3 is a diagram illustrating a partial configuration of a grinding apparatus having the chuck table mechanism according to embodiment 1.

A chuck table mechanism 1 according to embodiment 1 illustrated in FIG. 3 holds a plate-shaped workpiece 201 illustrated in FIG. 1. The plate-shaped workpiece 201 illustrated in FIG. 1 is, in the present embodiment, a wafer such as a disk-shaped semiconductor wafer or optical device wafer made of silicon, sapphire, gallium, or other base material. The workpiece 201 has, on a front side 202, devices 204, each formed in one of regions partitioned by a plurality of intersecting scheduled division lines 203. An integrated circuit (IC), a large scale integration (LSI), or a micro electro mechanical systems (MEMS) device is formed in each of the regions as the device 204. That is, ICs, LSIs, or MEMS are formed as the devices 204 on the side of the front side 202 of the workpiece 201.

Adhesive tape 210 is applied to the front side 202 of the workpiece 201 where the plurality of devices 204 are formed as illustrated in FIG. 2 so that the front side 202 is held on the chuck table mechanism 1 through the adhesive tape 210. In embodiment 1, the adhesive tape 210 is formed in the shape of a disk having the same diameter as the workpiece.

In embodiment 1, although a wafer is used as the workpiece 201, not only a wafer but also a package substrate sealed with resin, a ceramic plate, and a glass plate may also be used.

Figure 4:
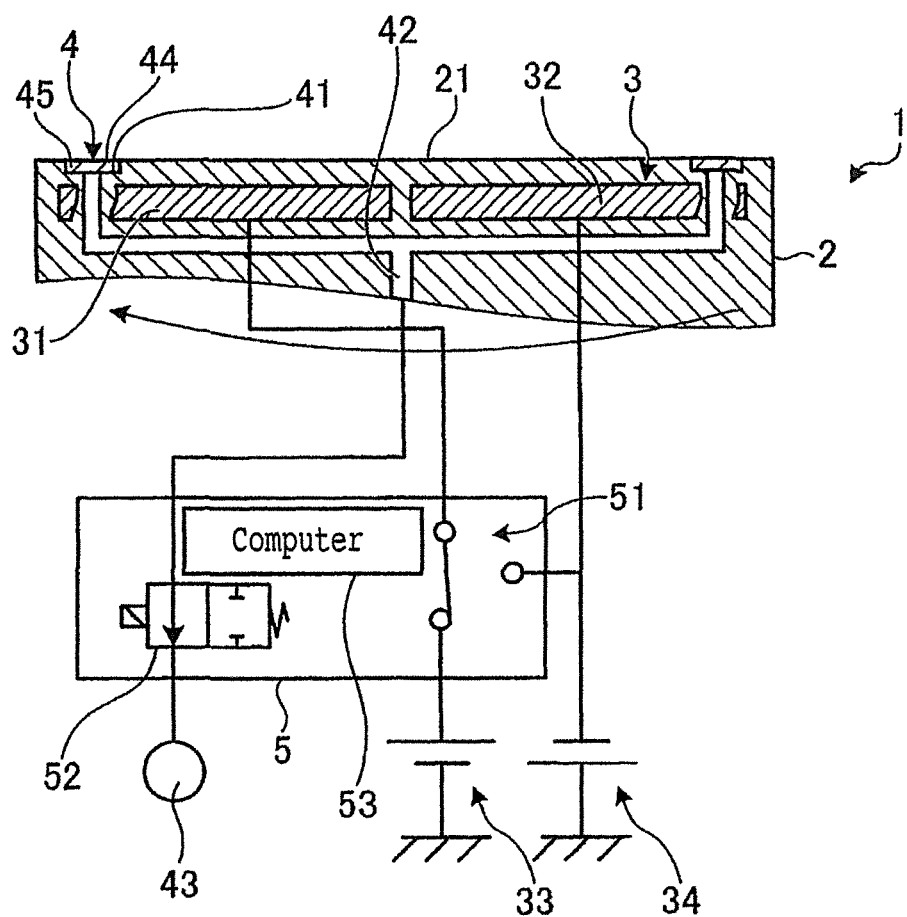
FIG. 4 is a side cross-sectional view of the chuck table mechanism according to embodiment 1.
Figure 5:
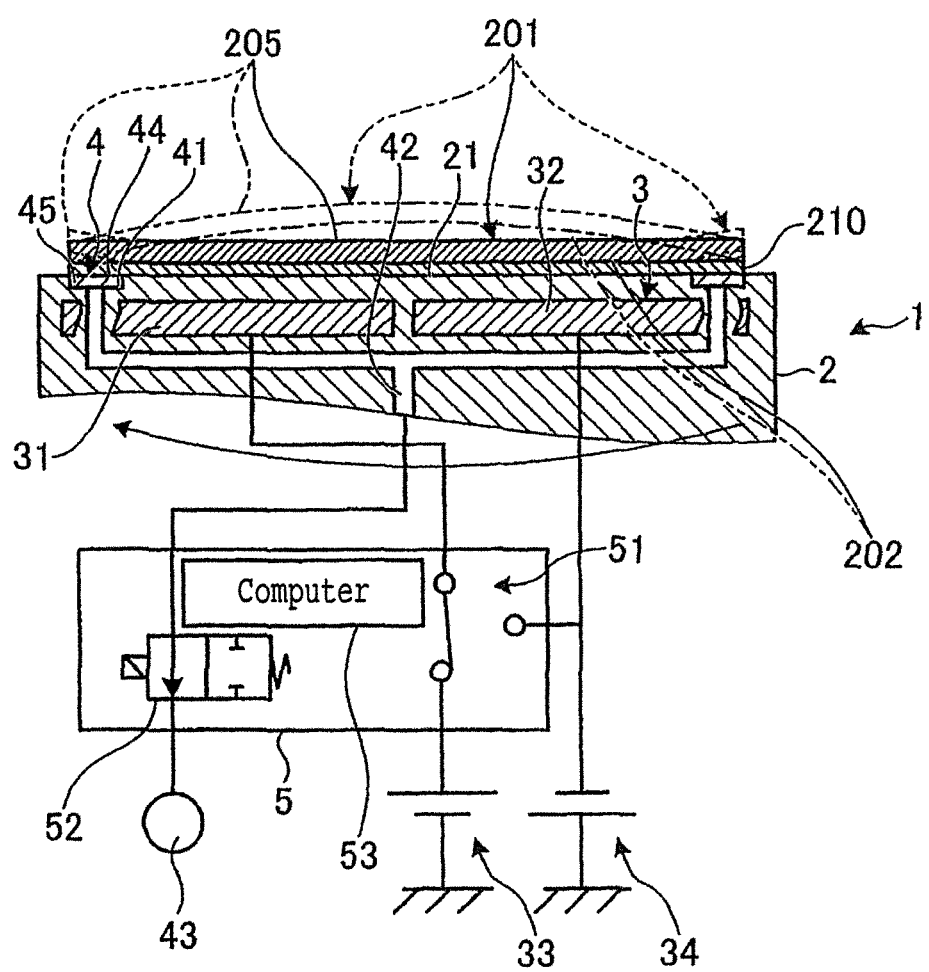
FIG. 5 is a side cross-sectional view illustrating a condition in which the chuck table mechanism illustrated in FIG. 4 holds a workpiece.

The chuck table mechanism 1 according to embodiment 1 making up a grinding apparatus 10, a processing apparatus illustrated in FIG. 3. The configuration of the grinding apparatus 10 will be described based on the drawings. FIG. 3 is a diagram illustrating a partial configuration of a grinding apparatus having the chuck table mechanism according to embodiment 1. FIG. 4 is a side cross-sectional view of the chuck table mechanism according to embodiment 1. FIG. 5 is a side cross-sectional view illustrating a condition in which the chuck table mechanism illustrated in FIG. 4 holds a workpiece.

The grinding apparatus 10 reduces the thickness of the workpiece 201 to a predetermined finish thickness by grinding a back side 205, the side opposite to the front side 202 of the workpiece 201. The grinding apparatus 10 includes the chuck table mechanism 1 and a grinding unit 20. The chuck table mechanism 1 holds the front side 202 of the workpiece 201 through the adhesive tape 210. The grinding unit 20 grinds the back side 205 of the workpiece 201 held on the chuck table mechanism 1.

The grinding unit 20 includes a spindle 25, a transfer unit (not illustrated), and a grinding wheel 22. The spindle 25 is rotated around an axial center parallel to a vertical direction by a motor which is not illustrated. The transfer unit transfers the spindle 25 in the vertical direction. The grinding wheel 22 includes a base 23 and grindstones 24. The base 23 is fitted to a lower end of the spindle 25. The grindstones 24 are arranged at equal spacings at a peripheral portion of the base 23. The grindstones 24 are opposed to the workpiece 201 held on the chuck table mechanism 1.

When the back side 205 of the workpiece 201 is ground, the grinding wheel 22 is rotated by the spindle 25, and the grindstones 24 are caused to approach the chuck table mechanism 1 by the transfer unit at a predetermined feed speed while grinding water made of pure water is being supplied to the back side 205 of the workpiece 201 held on the chuck table mechanism 1, and the chuck table mechanism 1 is rotated around the axial center parallel to the vertical direction.

It should be noted that, in embodiment 1, the axial center which is a center of rotation of the grinding wheel 22 of the grinding unit 20, and the axial center which is a center of rotation of the chuck table mechanism 1 are parallel to each other and arranged with a horizontal spacing therebetween, and the grindstone 24 passes through or near the center of the back side 205 of the workpiece 201. Although, in embodiment 1, the grinding apparatus 10, a processing apparatus having the chuck table mechanism 1, is illustrated, a cutting apparatus for cutting the workpiece 201, a polishing apparatus for polishing the workpiece 201, or a laser processing apparatus for processing the workpiece 201 with laser beam, each as a processing apparatus, may include the chuck table mechanism 1 in the present invention.

The chuck table mechanism 1 is a combined chuck table mechanism including an electrostatic attraction section 3 and a vacuum suction section 4 as illustrated in FIGS. 3 and 4. The chuck table mechanism 1 includes a disk-shaped chuck table 2 and a control unit 5.

The chuck table 2 is provided rotatably around the axial center parallel to the vertical direction. An upper surface 21 of the chuck table 2 is parallel to a horizontal direction. The workpiece 201 is placed on the upper surface 21. The upper surface 21 is a holding surface for holding the workpiece 201 that has been placed thereon. That is, the chuck table 2 includes the top surface 21 which is a holding surface for holding the workpiece 201.

The electrostatic attraction section 3 includes a positive electrode 31 and a negative electrode 32, both being electrodes. The positive electrode 31 and the negative electrode 32 are provided with a horizontal spacing therebetween and electrically insulated from each other. The positive electrode 31 and the negative electrode 32 is individually provided in the chuck table 2 to extend from a central portion of the chuck table 2 to a peripheral portion thereof. The positive electrode 31 and the negative electrode 32 are made, for example, of indium tin oxide (ITO). In embodiment 1, the positive electrode 31 and the negative electrode 32 are formed in the same semi-circular shape of the same size and arranged parallel to the upper surface 21.

A polarity selector switch 51 of the control unit 5 switches between a condition in which a positive voltage (power) is applied to the positive electrode 31 from a permanent power supply 33 and a condition in which a negative voltage (power) is applied to the positive electrode 31 from a permanent power supply 34. A negative voltage (power) is applied to the negative electrode 32 from the permanent power supply 34. The positive electrode 31 is positively charged through supply of positive power from the permanent power supply 33, positively charging the area of the upper surface 21, the holding surface, that overlaps the positive electrode 31. The negative electrode 32 is negatively charged through supply of negative power from the permanent power supply 34, negatively charging the area of the upper surface 21, the holding surface, that overlaps the negative electrode 32. The electrostatic attraction section 3 causes the positive electrode 31 to positively charge the area of the upper surface 21 that overlaps the positive electrode 31 and the negative electrode 32 to negatively charge the area of the upper surface 21 that overlaps the negative electrode 32, producing an electrostatic attraction force between the two areas and holding the workpiece 201 on the upper surface 21 by attraction using the electrostatic attraction force produced. Although, in embodiment 1, the electrostatic attraction section 3 causes the positive electrode 31 to positively charge the area of the upper surface 21 that overlaps the positive electrode 31 and the negative electrode 32 to negatively charge the area of the upper surface 21 that overlaps the negative electrode 32, only one electrode may be provided in the chuck table 2 in the present invention such that the workpiece 201 is held on the upper surface 21 by attraction by supplying positive or negative power to this single electrode and positively or negatively charging the entire upper surface 21.

The vacuum suction section 4 includes a porous portion 41 formed in an annular shape, a suction channel 42 provided in the chuck table 2, and a suction source 43. The porous portion 41 is made of a porous material such as porous ceramic and buried only in the peripheral portion of the chuck table 2 in such a manner as to be flush with the upper surface 21 of the chuck table 2. It should be noted that an upper surface 44 of the vacuum suction section 4 is parallel to the horizontal direction and is a holding surface for holding the workpiece 201. The porous portion 41 is provided along the entire circumference of the chuck table 2 and arranged in the peripheral portion of the chuck table 2. A plurality of fine holes 45 of the porous material making up the porous portion 41 are suction ports that are formed in the holding surface and communicate with the suction source 43. That is, the vacuum suction section 4 includes the fine holes 45, suction ports, provided in the porous portion 41.

The suction channel 42 is provided in the chuck table 2, and the communication between the lower surface of the porous portion 41 and the suction source 43 is ensured through the suction channel 42 and an on-off valve 52 of the control unit 5. The suction source 43 includes, for example, a vacuum pump. The suction source 43 sucks air from the porous portion 41 through the on-off valve 52 and the suction channel 42, and as a negative pressure is supplied to (acts on) the fine holes 45 of the porous portion 41, the vacuum suction section 4 holds the workpiece 201 on the upper surface 21 under suction.

The control unit 5 simultaneously supplies power to the positive electrode 31 and the negative electrode 32 and a negative pressure to the fine holes 45, suction ports, of the porous material, simultaneously producing an electrostatic attraction force and a negative pressure suction force and holding the workpiece 201 on the upper surface 21 by a combined force of the electrostatic attraction force and the negative pressure suction force. The control unit 5 is arranged between the suction channel 42 and the suction source 43 and includes the on-off valve 52 that connects the suction channel 42 and the suction source 43. The control unit 5 supplies a negative pressure from the suction source 43 to the fine holes 45, suction ports, of the porous portion 41 by opening the on-off valve 52.

The control unit 5 also includes the polarity selector switch 51. The polarity selector switch 51 switches between a condition in which positive power is supplied to the positive electrode 31 from the permanent power supply 33 and a condition in which negative power is supplied to the positive electrode 31 from the permanent power supply 34. The control unit 5 produces an electrostatic attraction force between the areas of the upper surface 21 that individually overlap the positive electrode 31 and the negative electrode 32 as a result of switching of the polarity selector switch 51 to the condition in which positive power is supplied to the positive electrode 31 from the permanent power supply 33.

In embodiment 1, the control unit 5 also includes a computer 53 that causes the grinding apparatus 10 to carry out a grinding operation to grind the back side 205 of the workpiece 201 by controlling each component of the grinding apparatus 10. The computer 53 includes an arithmetic processing unit having a microprocessor such as central processing unit (CPU), a storage apparatus having a memory such as read only memory (ROM) or a random access memory (RAM), and an input/output (I/O) interface apparatus.

The computer 53 carries out arithmetic processing in accordance with a computer program stored in the storage apparatus and outputs a control signal for controlling the grinding apparatus 10 to the components described above including the polarity selector switch 51 and the on-off valve 52 of the grinding apparatus 10 through the I/O interface apparatus. A display unit that is not illustrated and an input unit that is also not illustrated are connected to the control unit 5. The display unit includes a liquid crystal display for displaying a processing operation condition and images. The input unit is used by operators to register information regarding details of processing. The input unit includes at least either a touch panel provided on the display unit or an external input apparatus such as keyboard. It should be noted that although, in embodiment 1, the control unit 5 controls each component of the grinding apparatus 10, the control unit 5 for controlling the polarity selector switch 51 and the on-off valve 52 of the chuck table mechanism 1 may be provided separately from the control unit for controlling each component of the grinding apparatus 10 in the present invention.

The grinding apparatus 10 configured as described earlier initiates its processing operation in the case where an operator issues an instruction to start the processing operation following registration of processing detail information by the operator. During the processing operation, the grinding apparatus 10 closes the on-off valve 52 and supplies negative power to the positive electrode 31, and in this condition, the front side 202 of the workpiece 201 is placed on the upper surface 21 of the chuck table 2 of the chuck table mechanism 1 through the adhesive tape 210.

The control unit 5 of the grinding apparatus 10 not only drives the suction source 43 and opens the on-off valve 52 but also supplies positive power to the positive electrode 31 from the permanent power supply 33 by controlling the polarity selector switch 51 and produces an electrostatic attraction force and a negative pressure suction force at the same time, causing the workpiece 201 to be held to the upper surface 21 by a combined force of the electrostatic attraction force and the negative pressure suction force. The control unit 5 of the grinding apparatus 10 grinds the back side 205 of the workpiece 201 by rotating the chuck table 2 around the axial center and rotating the grinding wheel 22 of the grinding unit 20 around the axial center.

In the chuck table mechanism 1 according to embodiment 1, the positive electrode 31 and the negative electrode 32 of the electrostatic attraction section 3 are provided to extend from the central portion of the chuck table 2 to the peripheral portion thereof, with the porous portion 41 of the vacuum suction section 4 provided in the peripheral portion of the chuck table 2. In general, the electrostatic attraction section 3 is suitable for attracting the workpiece 201 in contact with the upper surface 21 because the upper surface 21, the holding surface, is positively or negatively charged. In contrast, the vacuum suction section 4 is suitable for sucking the workpiece 201 in the case where the space between the porous portion 41, the upper surface 21, and the workpiece 201 is closed because the workpiece 201 is sucked by negative pressure. This allows the electrostatic attraction section 3 of the chuck table mechanism 1 to attract the workpiece 201 by the area of the upper surface 21 which is in contact with the workpiece 201 even if the workpiece 201 warps in a form that is difficult to hold on the upper surface 21 under negative pressure created by the vacuum suction section 4. As a result, the chuck table mechanism 1 can hold the warping workpiece 201.

Further, because the control unit 5 produces an electrostatic attraction force with the electrostatic attraction section 3 and a negative pressure suction force with the vacuum suction section 4 at the same time, the chuck table mechanism 1 according to embodiment 1 provides an advantageous effect in that the warping workpiece 201 can be reliably held by attracting the area of the workpiece 201 in contact with the upper surface 21 using the electrostatic attraction section 3 and by pulling back, even if an area that readily comes off the upper surface 21 does so slightly, this area onto the upper surface 21 using the suction force produced by the vacuum suction section 4.

Further, in the chuck table mechanism 1, the positive electrode 31 and the negative electrode 32 of the electrostatic attraction section 3 are provided to extend from the central portion of the chuck table 2 to the peripheral portion thereof. Therefore, even if the workpiece 201 warps in the direction away from the upper surface 21, the holding surface, toward a periphery thereof as illustrated by dotted lines in FIG. 5, the positive electrode 31 and the negative electrode 32 of the electrostatic attraction section 3 attract the central portion of the workpiece 201 onto the central portion of the chuck table 2. This makes it possible for the chuck table mechanism 1 to hold the workpiece 201 warping in the direction away from the upper surface 21, the holding surface, toward the periphery thereof as illustrated by dotted lines in FIG. 5.

Further, in the chuck table mechanism 1, the porous portion 41 of the vacuum suction section 4 is provided in the peripheral portion of the chuck table 2. Because the porous portion 41 of the vacuum suction section 4 is provided in the peripheral portion of the chuck table 2, the peripheral portion of the workpiece 201 comes into contact with the porous portion 41 even if the workpiece 201 warps in the direction away from the upper surface 21, the holding surface, toward the central portion thereof as illustrated by long dashed double-short dashed lines in FIG. 5, and the space between the porous portion 41, the upper surface 21, and the workpiece 201 is closed. Therefore, a gas in this space is sucked by the vacuum suction section 4. As a result, the chuck table mechanism 1 can hold the workpiece 201 warping in the direction away from the upper surface 21, the holding surface, toward the central portion thereof as illustrated by long dashed double-short dashed lines in FIG. 5.

Further, in the chuck table mechanism 1, the porous portion 41 of the vacuum suction section 4 is provided only in the peripheral portion of the chuck table 2 so that a negative pressure suction force of the vacuum suction section 4 can be concentrated by locally producing the force. This cuts down the suction force of the suction source 43 and allows for the area of the workpiece 201 in close contact with the upper surface 21 to be attracted by the electrostatic attraction force. As a result, the chuck table mechanism 1 provides an advantageous effect in that the electrostatic attraction section 3 and the vacuum suction section 4 can complement each other to offset each other's weaknesses in holding the workpiece 201.

Embodiment 2

Figure 6:
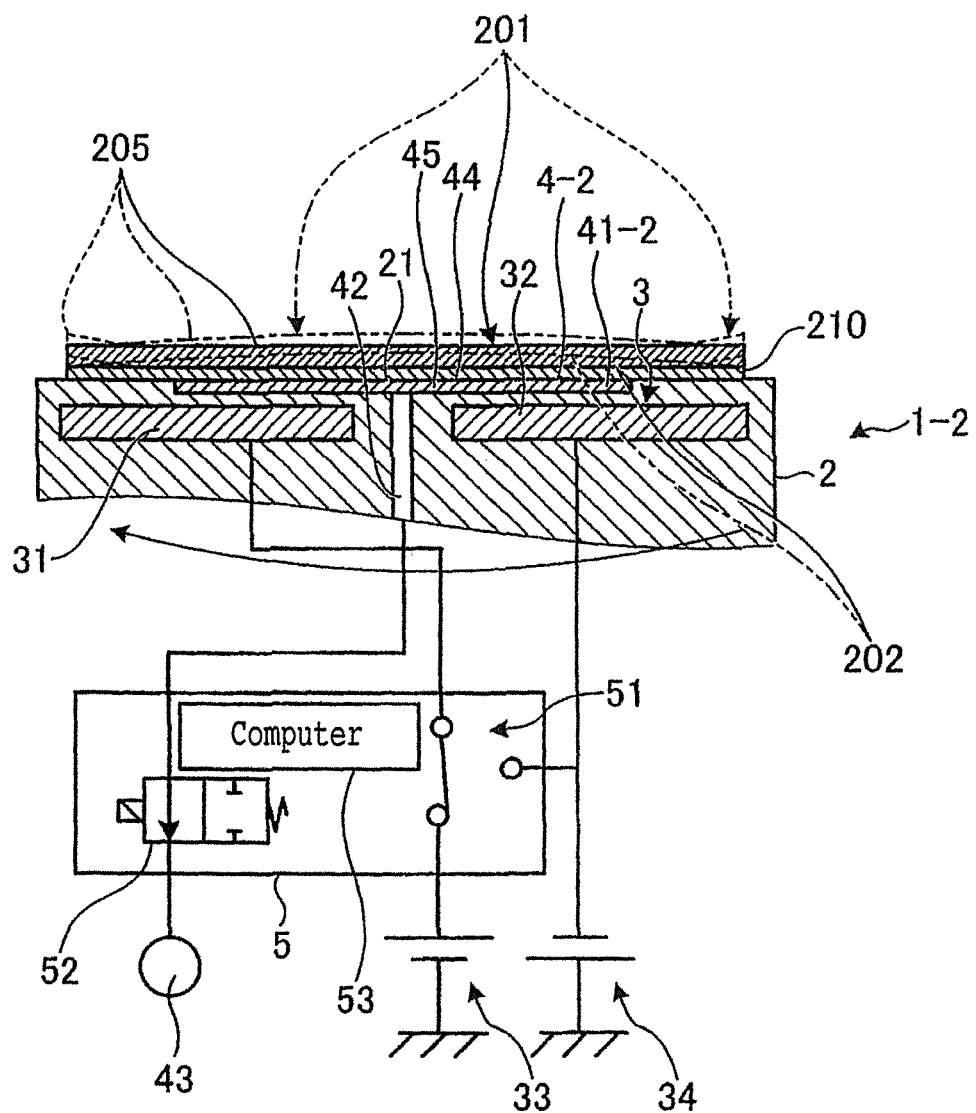
FIG. 6 is a side cross-sectional view illustrating a condition in which a chuck table mechanism according to embodiment 2 holds a workpiece.

A chuck table mechanism according to embodiment 2 of the present invention will now be described based on the drawing. FIG. 6 is a side cross-sectional view illustrating a condition in which a chuck table mechanism according to embodiment 2 holds a workpiece. It should be noted that the same components as those in embodiment 1 are denoted by the same reference numerals, and that the description thereof is omitted.

A chuck table mechanism 1-2 according to embodiment 2 has the same configuration as in embodiment 1 except for the arrangement of a porous portion 41-2 of a vacuum suction section 4-2. The porous portion 41-2 of the vacuum suction section 4-2 of the chuck table mechanism 1-2 is formed in the shape of a disk, is arranged only in the central portion of the upper surface 21 of the chuck table 2, and is arranged closer to the upper surface 21 than the positive electrode 31 and the negative electrode 32 of the electrostatic attraction section 3. The chuck table mechanism 1-2 produces an electrostatic attraction force and a negative pressure suction force at the same time as in embodiment 1, causing the workpiece 201 to be held to the upper surface 21 by a combined force of the electrostatic attraction force and the negative pressure suction force.

In the chuck table mechanism 1-2 according to embodiment 2, the positive electrode 31 and the negative electrode 32 and the porous portion 41-2 of the vacuum suction section 4-2 are provided in the chuck table 2. This allows the electrostatic attraction section 3 of the chuck table mechanism 1-2 to attract the workpiece 201 by the area of the upper surface 21 which is in contact with the workpiece 201 even if the workpiece 201 warps in a form that is difficult to hold on the upper surface 21 under negative pressure created by the vacuum suction section 4-2 alone. As a result, the chuck table mechanism 1-2 can hold the warping workpiece 201 as in embodiment 1.

Further, in the chuck table mechanism 1-2, the positive electrode 31 and the negative electrode 32 of the electrostatic attraction section 3 and the porous portion 41-2 of the vacuum suction section 4-2 are provided in the central portion of the chuck table 2. Therefore, even if the workpiece 201 warps in the direction away from the upper surface 21, the holding surface, toward the periphery thereof as illustrated by dotted lines in FIG. 6, the positive electrode 31 and the negative electrode 32 of the electrostatic attraction section 3 and the porous portion 41-2 of the vacuum suction section 4-2 hold the central portion of the workpiece 201 onto the chuck table 2. This makes' it possible for the chuck table mechanism 1-2 to hold the workpiece 201 warping in the direction away from the upper surface 21, the holding surface, toward the periphery thereof as illustrated by dotted lines in FIG. 6.

Further, because, in the chuck table mechanism 1-2, the porous portion 41-2 of the vacuum suction section 4-2 is provided in the central portion of the upper surface 21, the peripheral portion of the workpiece 201 comes into contact with the upper surface 21 even if the workpiece 201 warps in the direction away from the upper surface 21, the holding surface, toward the central portion thereof as illustrated by long dashed double-short dashed lines in FIG. 6, and the space between the porous portion 41, the upper surface 21, and the workpiece 201 is closed. Therefore, the gas in this space is sucked by the vacuum suction section 4-2. As a result, the chuck table mechanism 1-2 can hold the workpiece 201 warping in the direction away from the upper surface 21, the holding surface, toward the central portion thereof as illustrated by long dashed double-short dashed lines in FIG. 6.

It should be noted that the present invention is not limited to the above embodiments. That is, the present invention may be modified in various ways without departing from the scope of the present invention.

The present invention is not limited to the details of the above described preferred embodiments. The scope of the invention is defined by the appended claim and all changes and modifications as fall within the equivalence of the scope of the claim are therefore to be embraced by the invention.

What is claimed is:

1. A combined chuck table mechanism having an electrostatic attraction section and a vacuum suction section, the combined chuck table mechanism comprising:
   a chuck table having a holding surface for holding a plate-shaped workpiece, the chuck table having a circumference;
   electrodes provided in the chuck table for charging the holding surface through supply of power and electrostatically attracting the workpiece;
   suction ports formed in the holding surface to communicate with a suction source, the suction ports made of porous material arranged in an annular shape in the holding surface; and a control unit adapted to achieve holding of the workpiece through a combined force by supplying power to the electrodes and a negative pressure to the suction ports.

2. The combined chuck table mechanism according to claim 1, wherein the porous material arranged in an annular shape in the holding surface is located adjacent the circumference of the chuck table.

3. The combined chuck table mechanism according to claim 2, wherein the porous material is made of porous ceramic located only near to circumference of the chuck table and flush with the holding surface.

4. The combined chuck table mechanism according to claim 2, wherein the electrodes comprise two semi-circularly shaped electrodes.

5. The combined chuck table mechanism according to claim 1, wherein the electrodes comprise two semi-circularly shaped electrodes.

6. The combined chuck table mechanism according to claim 1, wherein the electrodes comprise oppositely charged electrodes.

7. The combined chuck table mechanism according to claim 1, wherein the chuck table has an axial center about which the chuck table is rotatable.

8. The combined chuck table mechanism according to claim 7, wherein the electrodes comprise two oppositely charged electrodes located on opposite sides of the axial center of the chuck table.

9. The combined chuck table mechanism according to claim 8, wherein the electrodes are made of indium tin oxide.

10. The combined chuck table mechanism according to claim 1, further comprising a polarity selector switch and a control unit configured to switch applying a positive voltage to a first one of the electrodes and a negative voltage to the first one of the electrodes.

11. A combined chuck table mechanism having an electrostatic attraction section and a vacuum suction section, the combined chuck table mechanism comprising:
 a chuck table having a holding surface for holding a plate-shaped workpiece, the chuck table having a circumference;
 oppositely charged electrodes provided in the chuck table for charging the holding surface through supply of power and electrostatically attracting the workpiece;
 suction ports formed in the holding surface to communicate with a suction source; and
 a control unit adapted to achieve holding of the workpiece through a combined force by supplying power to the electrodes and a negative pressure to the suction ports.

12. The combined chuck table mechanism according to claim 11, further comprising a polarity selector switch and a control unit configured to switch applying a positive voltage to a first one of the electrodes and a negative voltage to a second one of the electrodes.

13. The combined chuck table mechanism according to claim 12, wherein the first one of the electrodes positively charges an area of the holding surface adjacent the first one of the electrodes when a positive voltage is applied to the first one of the electrodes and wherein the second one of the electrodes negatively charges an area of the holding surface adjacent the second one of the electrodes when a negative voltage is applied to the second one of the electrodes.

14. The combined chuck table mechanism according to claim 11, wherein a first one of the electrodes positively charges an area of the holding surface adjacent the first one of the electrodes when a positive voltage is applied to the first one of the electrodes and wherein a second one of the electrodes negatively charges an area of the holding surface adjacent the second one of the electrodes when a negative voltage is applied to the second one of the electrodes.

15. The combined chuck table mechanism according to claim 11, wherein the chuck table has an axial center about which the chuck table is rotatable and wherein the electrodes comprise oppositely charged electrodes located on opposite sides of the axial center of the chuck table.

16. The combined chuck table mechanism according to claim 15, wherein the electrodes comprise two semi-circularly shaped electrodes.

17. The combined chuck table mechanism according to claim 16, wherein the electrodes extend from a central portion of the chuck table to a peripheral portion of the chuck table.

18. The combined chuck table mechanism according to claim 11, wherein the electrodes comprise two semi-circularly shaped electrodes.

19. The combined chuck table mechanism according to claim 11, wherein the electrodes extend from a central portion of the chuck table to a peripheral portion of the chuck table.

20. The combined chuck table mechanism according to claim 11, wherein the electrodes are arranged parallel to the holding surface.

* * * * *